United States Patent
Bet-Shliemoun

(10) Patent No.: US 8,084,348 B2
(45) Date of Patent: Dec. 27, 2011

(54) CONTACT PADS FOR SILICON CHIP PACKAGES

(75) Inventor: Ashur S. Bet-Shliemoun, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 266 days.

(21) Appl. No.: 12/132,716

(22) Filed: Jun. 4, 2008

(65) Prior Publication Data

US 2009/0302453 A1    Dec. 10, 2009

(51) Int. Cl.
*H01L 21/4763* (2006.01)

(52) U.S. Cl. ........ 438/612; 438/117; 438/613; 438/614; 438/615; 438/650; 438/652; 438/642; 438/678; 438/686; 438/761; 257/E21.476; 257/E21.509

(58) Field of Classification Search .................. 438/612, 438/117
See application file for complete search history.

(56) References Cited

U.S. PATENT DOCUMENTS

| | | | | |
|---|---|---|---|---|
| 6,091,137 A * | 7/2000 | Fukuda | .......................... | 257/679 |
| 6,250,933 B1 * | 6/2001 | Khoury et al. | .................. | 439/66 |
| 6,362,520 B2 * | 3/2002 | DiStefano | ...................... | 257/696 |
| 6,524,892 B1 * | 2/2003 | Kishimoto et al. | ........... | 438/120 |
| 6,528,349 B1 * | 3/2003 | Patel et al. | ...................... | 438/117 |
| 6,552,419 B2 * | 4/2003 | Toyosawa | ...................... | 257/668 |
| 6,709,895 B1 * | 3/2004 | Distefano | ...................... | 438/115 |
| 6,953,707 B2 * | 10/2005 | Variyam | ....................... | 438/106 |
| 7,432,202 B2 * | 10/2008 | Saha et al. | ..................... | 438/686 |
| 7,758,351 B2 * | 7/2010 | Brown et al. | ..................... | 439/66 |
| 2001/0020545 A1 * | 9/2001 | Eldridge et al. | .............. | 174/260 |
| 2001/0027007 A1 * | 10/2001 | Hosomi et al. | ................ | 438/611 |
| 2002/0056922 A1 * | 5/2002 | Funaya et al. | ................. | 257/778 |
| 2003/0102160 A1 * | 6/2003 | Gaudiello et al. | ............ | 174/262 |
| 2007/0108627 A1 * | 5/2007 | Kozaka et al. | ................. | 257/778 |

* cited by examiner

*Primary Examiner* — Charles Garber
*Assistant Examiner* — Pape Sene
(74) *Attorney, Agent, or Firm* — Brooks Kushman P.C.

(57) ABSTRACT

A method for manufacturing a silicon chip package for a circuit board assembly provides a package with a silicon chip and an array of first contact pads that are provided by a first conductive material. A plurality of second contact pads are provided from a gold material having a hardness different than that of the first contact pads. The second contact pads are soldered to the first contact pads of the package. A circuit board assembly is assembled by providing a circuit board substrate with at least one socket with contact pads. The second contact pads of the package are assembled to the circuit board substrate contact pads.

20 Claims, 2 Drawing Sheets

CONTACT PADS FOR SILICON CHIP PACKAGES

BACKGROUND

1. Technical Field

Embodiments of the invention relate to contact pads for silicon chip packages for attachment to circuit boards.

2. Background Art

The prior art provides circuit board assemblies with components attached thereto, including silicon chip packages. The packages enclose a silicon chip in an organic or ceramic material. The packages often include a land grid array of contact pads for contacting corresponding contact pads on a circuit board such as a printed circuit board. The land grid array pads typically include a solder material that is plated with a soft and electroless gold material. Subsequently, the land grid array pads are attached to the contact pads on the printed circuit board by soldering with a solder ball grid array, by pins, or with a land grid array socket.

SUMMARY

One embodiment discloses a method for manufacturing a silicon chip package for a circuit board assembly. The method provides a package with a silicon chip and an array of first contact pads that are provided by a first conductive material. A plurality of second contact pads are provided from a gold material that has a hardness different than that of the first contact pads. The second contact pads are conductively bonded to the first contact pads of the package.

Another embodiment discloses a method for assembling a circuit board assembly. The method provides a package with a silicon chip and an array of first contact pads that are provided by a first conductive material. A plurality of second contact pads are provided from a gold material that has a hardness different than that of the first contact pads. The second contact pads are conductively bonded to the first contact pads of the package. A circuit board substrate is provided with at least one socket with an array of contact pads. The second contact pads of the package are assembled to the contact pads of the circuit board substrate.

Another embodiment provides a silicon chip package for a circuit board assembly with a package body. A silicon chip is enclosed within the body. An array of first contact pads are formed of a first conductive material. An array of second contact pads are formed of a gold material that has a hardness different than that of the first contact pads, and are conductively bonded to the first contact pads.

Yet another embodiment provides a circuit board assembly with a circuit board substrate having at least one socket with an array of contact pads. A silicon chip is enclosed within a package body. An array of first contact pads are formed of a first conductive material. An array of second contact pads are formed of a gold material that has a hardness different of that of the first contact pads, and are conductively bonded to the first contact pads. The second contact pads of the package are assembled to the contact pads of the circuit board.

Another embodiment manufactures a silicon chip package for a circuit board assembly by a method of providing a package with a silicon chip and an array of first contact pads provided by a first conductive material. A plurality of second contact pads are provided by a gold material having a hardness different than that of the first contact pads. The second contact pads are conductively bonded to the first contact pads of the package.

Another embodiment assembles a circuit board assembly by a method of providing a package with a silicon chip and an array of first contact pads provided by a first conductive material. A plurality of second contact pads are provided by a gold material having a hardness different than that of the first contact pads. The second contact pads are conductively bonded to the first contact pads of the package. A circuit board substrate is provided with at least one socket with contact pads. The second contact pads of the package are assembled to the contact pads of the circuit board substrate.

DETAILED DESCRIPTION OF EMBODIMENTS

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for the claims and/or a representative basis for teaching one skilled in the art to variously employ the present invention.

Figure 1:
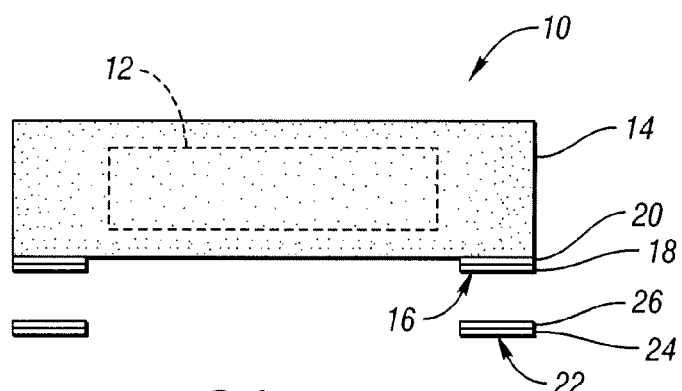
FIG. 1 is an elevation view of a silicon chip package according to an embodiment, illustrated with first and second contact pads.

Referring now to FIG. 1, a silicon chip package is illustrated according to an embodiment and is referenced generally by numeral 10. The package 10 includes a silicon chip 12 that is enclosed within a body 14, which may be fabricated from an organic or ceramic material. The package 10 may provide a central processing unit, an application specific integrated circuit, or the like.

The package 10 includes a land grid array of contact pads 16 for connecting the package 10 to an associated circuit board. The land grid array 16 is provided by a high purity gold material that is plated as pads 18 upon an underlying contact layer 20. The underlying layer 20 is often provided by a metal such as nickel. The prior art plating of the gold pads 18 upon the underlying contact layers 20 is limited to the process of electroless plating, which is the deposition of metal by chemical adhesion, not electrical. Electroless plating of gold requires high purity gold, which is relatively soft. Prior art packages are often connected directly to the associated circuit board. Due to the relatively soft characteristics of the pads 18, processing of the package 10, such as testing and subsequent assembly to the printed circuit board can result in damage to the soft gold pads 18. Such damage includes deformation of the contact pads 18 or separation of the contact pads 18 thereby revealing the underlying layer 20. Exposure of the underlying contact layer 20 can result in oxidizing or corrosion during testing of the package 10 that may subsequently impair or prevent a connection of the soft gold pads 18 to a circuit board assembly. Additionally, the soft contact pads 18 are susceptible to damage when assembled to a spring contact pad of a socket. Such assembly typically requires the soft contact pads 18 to be pressed against the spring contact pads to depress the contact pads.

In order to prevent the shortcomings of the prior art, a plurality of secondary contact pads 22 are provided to the package 10. The secondary contact pads 22 each include a hard gold pad 24 that has a hardness greater than that of the soft gold pads 18. The hard gold pads 24 are each connected to one of the soft gold pads 18 in order to provide adequate electrical contact from a material having a hardness that is capable of withstanding testing and subsequent assembly to a circuit board. The hard gold pads 24 are formed of a hardness that is greater than the hardness of the gold pads 18 that are plated directly to the package 10. For example, the hard gold pads 24 are provided by electroplating. Electroplating is not limited to high purity gold and therefore, permits utilization of a gold material having a hardness greater than that permitted by electroless plating.

The secondary contact pads 22 are provided with a preform solder layer 26. The solder layer 26 may be preformed from a material such as nickel-cobalt ferrous alloy, copper, nickel-iron alloy, tin-lead (SnPb), tin-silver-copper (SnAgCu), or the like. The hard gold pad 24 is electroplated upon the preform solder layer 26, but is not limited in hardness as in the electroless plating process associated with plating gold upon silicon chip packages. The secondary contact pads 22 are formed of a size similar to that of the package contact pads 16, for example, 0.7 millimeters by 0.7 millimeters. Of course, any suitable size is contemplated. Subsequently, the secondary contact pads 22 are placed upon the package contact pads 16 and soldered thereto. Alternatively, the secondary contact pads 22 can be brazed to the package contact pads 16.

Although the package contact pads 16 are described as including soft gold pads 18, the invention contemplates utilization of any suitable metal for subsequent attachment of the secondary contact pads 22. The soft gold pads 18 are described because this configuration is commonly available in the prior art. However, since the secondary contact pads 22 provide the direct contact with an associated circuit board, soft gold may not be necessary for the package contact pads 16.

Figure 2:
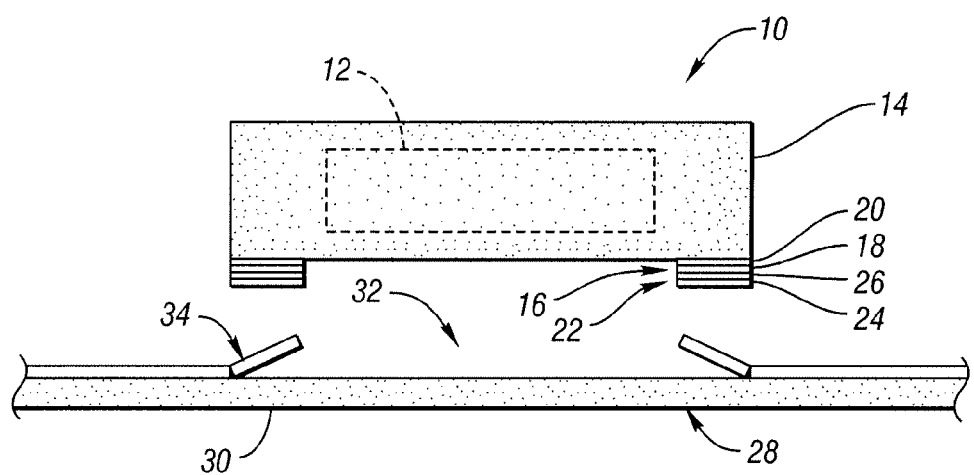
FIG. 2 illustrates the silicon chip package of FIG. 1 with the second contact pads assembled to the first contact pads prior to assembly to a circuit board substrate.

Once the secondary contact pads 22 are connected to the package contact pads 16, reliability and environmental testing (including electrical and thermo-mechanical testing) can be performed without risking the integrity of the contact pads 16. Subsequently, the packages 10 are mounted to a circuit board. Referring now to FIG. 2, the package 10 is illustrated prior to assembly to a circuit board 28, such as a printed circuit board. The circuit board 28 includes a substrate 30 for supporting printed circuitry and components such as the package 10. A socket 32 is provided with a corresponding array of contact pads 34 for receiving the secondary contact pads 22 of the package 10. The socket contact pads 34 extend from the substrate 30 as leaf springs for maintaining engagement and electrical communication with the associated secondary contact pads 22. The leaf springs 34 are sized generally equivalent to the secondary contact pads 22 as illustrated. The package 10 may be connected to the circuit board contact pads 34 by pressing the package 10 against the socket contact pads 34 while affixing the package 10 to the substrate 30.

Figure 3:
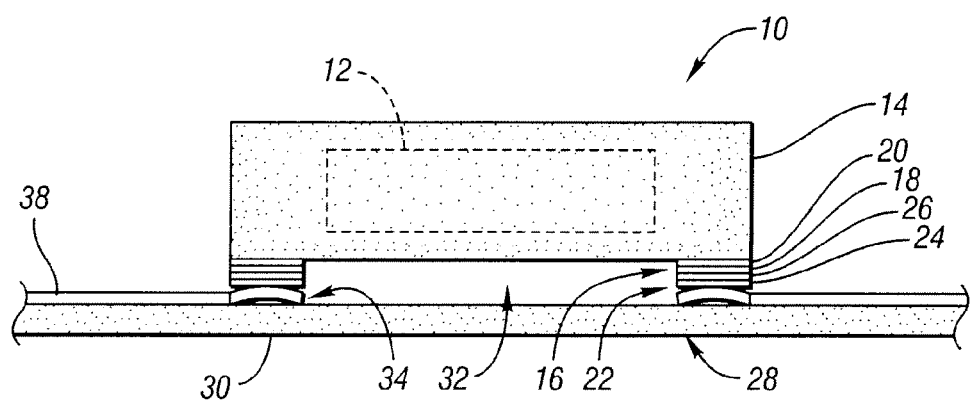
FIG. 3 illustrates the silicon chip package of FIG. 1, illustrated assembled to the circuit board substrate of FIG. 2.

FIG. 3 illustrates the package 10 assembled to the contact pads 34 of the circuit board 28. The circuit board contact pads 34 are pressed against the secondary contact pads 22 of the substrate 30. Thus, the package 10 becomes an assembled component to the circuit board 28 for communication through printed circuitry upon the substrate 30 of the printed circuit board 28.

In addition to protecting the soft gold pads 18 from testing, the secondary contact pads 22 with the hard gold pads 24 protect the soft gold pads 18 during assembly to the circuit board 28. Such assembly may require depression of the socket spring contact pads 34 as illustrated in FIGS. 2 and 3, or attachment via pins, which may damage the soft gold pads 18 of the primary contact pads 16 of the package 10. Accordingly, such damage is avoided by providing the hard gold pads 24.

Figure 4:
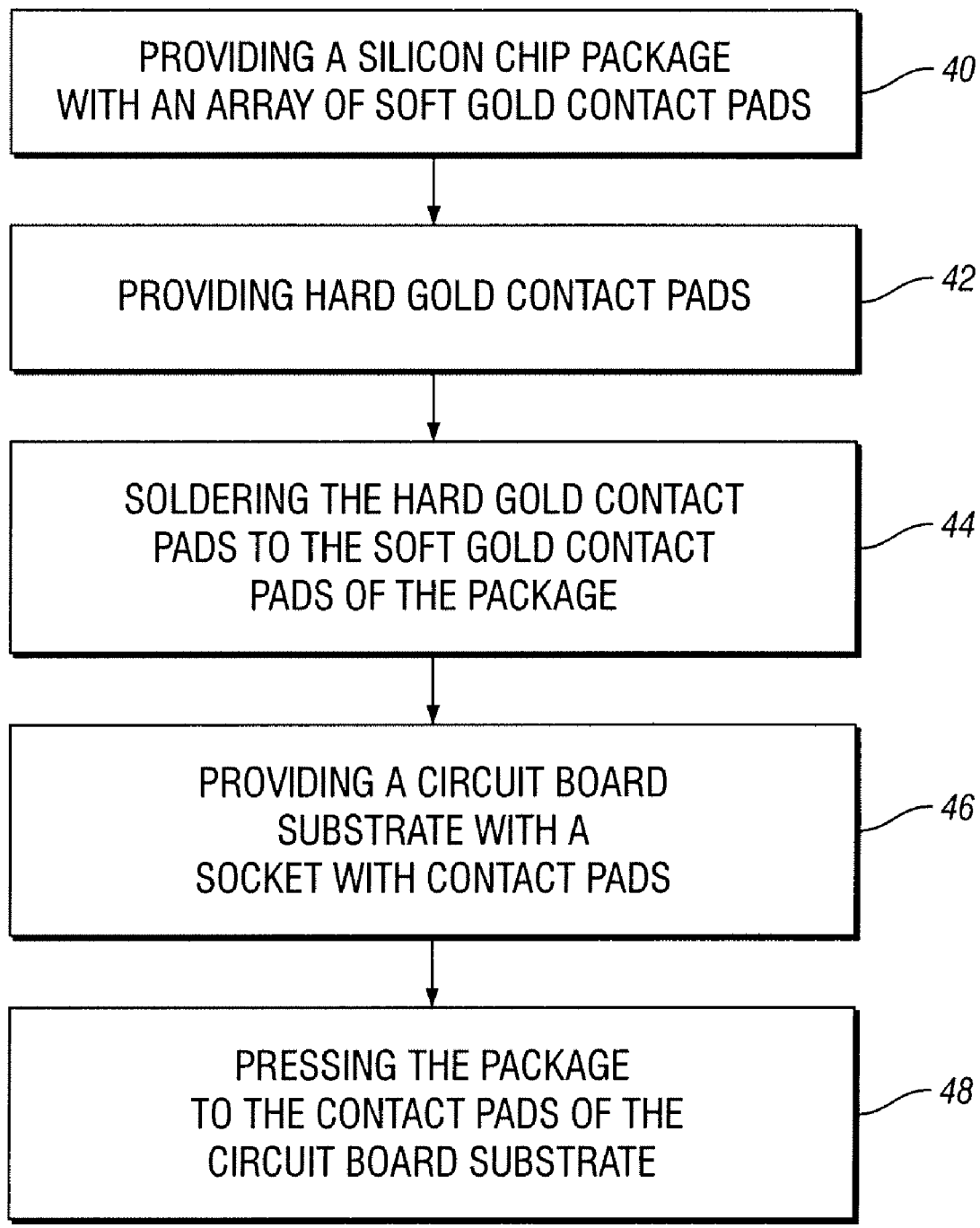
FIG. 4 is a flowchart illustrating a method for assembling a circuit board assembly according to another embodiment.

The secondary contact pads 22 provide a relatively quick solution for providing a package 10 with gold pads 24 of a sufficient hardness to withstand testing and assembly. FIG. 4 illustrates a flowchart of a method for assembling a circuit board assembly according to at least one embodiment. The method begins with steps for manufacturing a silicon package 10. At block 40, the silicon chip package 10 is provided with an array of soft gold contact pads 18. At block 42, the hard gold contact pads 22 are provided. The hard gold contact pads 22 are soldered to the soft gold contact pads 18 of the package at block 44. A circuit board substrate 30 is provided with a socket 32 with contact pads 34 in block 46. The hard gold contact pads 22 are pressed to the contact pads 34 of the circuit board substrate 30 in block 48.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for manufacturing a silicon chip package for a circuit board assembly comprising:

providing a package with a silicon chip;

plating an array of high purity gold contact pads onto the package;

preforming a plurality of solder preforms selected from a group consisting of nickel-cobalt ferrous alloy, copper, nickel-iron alloy, tin-lead, and tin-silver-copper;

providing a plurality of hard gold contact pads from a gold material having a hardness greater than that of the array of high purity gold contact pads; and soldering the plurality of hard gold contact pads with the plurality of solder preforms to the array of high purity gold contact pads of the package.

2. The method of claim 1 further comprising plating the high purity gold pads onto the package by electroless plating.

3. The method of claim 1 further comprising plating the plurality of hard gold contact pads onto the solder preforms.

4. The method of claim 1 further comprising plating the plurality of hard gold contact pads onto the solder preforms by electroplating.

5. The method of claim 1 further comprising plating the plurality of hard gold contact pads with a size generally equivalent to the high purity gold contact pads.

6. A method for assembling a circuit board assembly comprising:

manufacturing a silicon chip package according to the method of claim 1;

providing a circuit board substrate with at least one socket with an array of contact pads; and assembling the plurality hard gold contact pads to the array of contact pads of the circuit board substrate.

7. The method of claim 6 further comprising:

forming each of the array of contact pads of the at least one socket with a spring extending from the circuit board substrate; and pressing the silicon chip package to the substrate thereby deforming the spring of each contact pad while affixing the package to the substrate.

8. The method of claim 1 further comprising preforming the plurality of solder preforms from nickel-cobalt ferrous alloy.

9. The method of claim 1 further comprising preforming the plurality of solder preforms from copper.

10. The method of claim 1 further comprising preforming the plurality of solder preforms from nickel-iron alloy.

11. The method of claim 1 further comprising preforming the plurality of solder preforms from tin-lead.

12. The method of claim 1 further comprising preforming the plurality of solder preforms from tin-silver-copper.

13. A method for assembling a circuit board assembly comprising: providing a package with a silicon chip and an array of first contact pads provided by a first gold material; providing a plurality of second contact pads from a second gold material having a hardness different than that of the array of first contact pads; conductively bonding the plurality of second contact pads to the array of first contact pads of the package; providing a circuit board substrate with at least one socket with an array of contact pads; assembling the plurality second contact pads to the array of contact pads of the circuit board substrate; forming each of the array of contact pads of the at least one socket with a spring sized generally equivalent to the corresponding contact pad of the plurality of second contact pads for extending from the circuit board substrate; and pressing the silicon chip package to the substrate thereby deforming the spring of each contact pad while affixing the package to the substrate, wherein after the pressing the silicon package, both ends of the spring directly contact the substrate.

14. The method of claim 13 further comprising forming each spring as a leaf spring.

15. The method of claim 13 further comprising forming each of the plurality of second contact pads with a contact size of approximately 0.7 millimeters by 0.7 millimeters.

16. The method of claim 13 further comprising providing the array of first contact pads by a high purity gold material.

17. The method of claim 16 further comprising plating the high purity gold pads onto the package.

18. The method of claim 16 further comprising plating the high purity gold pads onto the package by electroless plating.

19. The method of claim 16 further comprising brazing the plurality of second contact pads to the first contact pads of the package.

20. The method of claim 13 further comprising preforming solder for soldering the plurality of second contact pads to the first contact pads.

* * * * *